(12) United States Patent
Arnold et al.

(10) Patent No.: US 8,853,642 B2
(45) Date of Patent: Oct. 7, 2014

(54) BEAM REGULATING APPARATUS FOR AN EUV ILLUMINATION BEAM

(71) Applicant: Carl Zeiss SMT GmbH, Oberkochen (DE)

(72) Inventors: Ralf Arnold, Aalen (DE); Ulrich Mueller, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 13/843,753

(22) Filed: Mar. 15, 2013

(65) Prior Publication Data

US 2013/0248728 A1    Sep. 26, 2013

Related U.S. Application Data

(60) Provisional application No. 61/615,597, filed on Mar. 26, 2012.

(30) Foreign Application Priority Data

Mar. 23, 2012   (DE) .......................... 10 2012 204 674

(51) Int. Cl.
| | |
|---|---|
| *G01J 1/42* | (2006.01) |
| *G03F 1/84* | (2012.01) |
| *G03F 7/20* | (2006.01) |
| *G02B 26/00* | (2006.01) |

(52) U.S. Cl.
CPC   *G02B 26/00* (2013.01); *G03F 1/84* (2013.01); *G03F 7/70141* (2013.01); *G03F 7/20* (2013.01); *G03F 7/7085* (2013.01)
USPC ........................................................ 250/372

(58) Field of Classification Search
CPC ........... G03F 7/20; G03F 9/7026; G03F 7/70; G03F 1/7085
USPC ................................................................ 250/372
See application file for complete search history.

(56) References Cited

U.S. PATENT DOCUMENTS

| | | | |
|---|---|---|---|
| 4,140,398 A | 2/1979 | Hodder .......................... 356/152 |
| 5,489,986 A * | 2/1996 | Magome et al. ............... 356/401 |
| 5,508,527 A * | 4/1996 | Kuroda et al. ............. 250/491.1 |
| 7,112,813 B2 * | 9/2006 | Den Boef et al. .......... 250/559.3 |

(Continued)

FOREIGN PATENT DOCUMENTS

| | | | |
|---|---|---|---|
| DE | 10220815 | 11/2003 | ............... G21K 7/00 |

OTHER PUBLICATIONS

German Examination Report, German Application No. 10 2012 204 674.7, 7 pages, Nov. 20, 2012.

*Primary Examiner* — Kiho Kim
(74) *Attorney, Agent, or Firm* — Fish & Richardson P.C.

(57) ABSTRACT

A beam regulating apparatus for an EUV illumination beam has a position sensor device and a control/regulating device, which is signal-connected to the position sensor device. Furthermore, at least one beam regulating component which influences the beam path of the illumination beam is signal-connected to the control/regulating device. The position sensor device has at least one diffraction grating for generating at least two reference partial beams from the illumination beam. Furthermore, the position sensor device has a respective position sensor assigned to one of the reference partial beams, for detecting the assigned reference partial beam. This results in a beam regulating apparatus which enables well-controllable illumination in conjunction with a simple construction.

20 Claims, 7 Drawing Sheets

(56) References Cited

U.S. PATENT DOCUMENTS

| | | | |
|---|---|---|---|
| 2001/0008273 A1* | 7/2001 | Groeneveld et al. | 250/492.1 |
| 2004/0184018 A1* | 9/2004 | Groeneveld et al. | 355/53 |
| 2005/0184248 A1* | 8/2005 | Kanazawa et al. | 250/372 |
| 2008/0017810 A1 | 1/2008 | Frijns | 250/492.2 |
| 2008/0094642 A1* | 4/2008 | Okita | 356/622 |
| 2009/0161093 A1 | 6/2009 | Downey | 356/139.05 |

\* cited by examiner

BEAM REGULATING APPARATUS FOR AN EUV ILLUMINATION BEAM

CROSS-REFERENCE TO RELATED APPLICATIONS

This application claims priority to U.S. Provisional Application No. 61/615,597, filed on Mar. 26, 2012, and German application 10 2012 204 674.7, filed on Mar. 23, 2012. The entire contents of the above applications are hereby incorporated by reference.

BACKGROUND

The disclosure relates to a beam regulating apparatus for an EUV illumination beam. Furthermore, the disclosure relates to a position sensor device for use in such a beam regulating apparatus, an optical system including such a beam regulating apparatus, and a metrology system including such an optical system.

US 2008/0 017 810 A1 discloses an EUV light source in which a beam impingement position of a laser constituting part of the light source is readjusted.

U.S. 2009/0161093 A1 discloses systems and methods for lithographic illuminator beam deviation measurement and calibration using grating sensors. U.S. Pat. No. 4,140,398 discloses a laser autoalignment system using distortion compensated reflection grating.

SUMMARY

In one aspect, a beam regulating apparatus is provided in which the beam regulating apparatus enables well-controllable illumination in conjunction with a simple construction.

The beam regulating apparatus can have one or more of the following features. A position sensor device having at least one diffraction grating results in the possibility of generating reference partial beams which are suitable for position detection for EUV wavelengths as well. In this case, it is possible to make use of the effect of using equally valid diffraction orders, for example the – first and the + first diffraction order, for position detection. The at least one diffraction grating can be embodied as a phase grating. To give preference to a selected diffraction order, the diffraction grating can be embodied as a blazed grating. Exactly two position sensors can be used in the position sensor device. A larger number of position sensors is also possible.

In some examples, it is possible to detect all reference partial beams detected for beam regulation with a high signal/noise ratio.

A coupling-out element can make available a reference beam used for position detection. Alternatively, the diffraction grating can simultaneously have the function of the coupling-out element. In this alternative, the reference partial beams are generated directly from the illumination beam.

Position sensors can be arranged in pairs to enable a precise detection of a beam position dimension. One of said position sensors arranged in pairs can detect a +n-th and the other a –n-th diffraction order of the assigned reference partial beam, that is to say for example the + first and the – first or the + second and the – second diffraction order. Equally valid diffraction orders can therefore be detected.

Photodiodes can be used for detection purposes.

A filter element can be embodied as a neutral wedge having the layer thickness that changes monotonically along a detection direction. Alternatively or additionally, the receiver area can have, along the detection direction, a changing throughput with uniform layer thickness. Said changing throughput can be brought about for example by means of a changing scattering center density or absorption. The filter element can be operated in transmission or in reflection.

A diffraction grating can be provided, resulting in the possibility of embodying the position sensor device with exactly one diffraction grating. A two-dimensional grating affords the possibility of generating four reference partial beams which can be used to measure simultaneously two mutually perpendicular beam position dimensions transversely with respect to the beam direction of the illumination beam. The diffraction grating can be embodied as a cross grating.

An alternative design of the position sensor device places less stringent demands on the production of the respective diffraction grating.

A normalization detector allows a normalization adjustment in the case of the beam position dimension, which contributes to improving the detection accuracy. The normalization beam can be a further diffraction order of the diffraction grating, said further diffraction order not being used for position detection with the at least one position sensor. Alternatively, in the case of a plurality of coupled-out reference beams or a plurality of coupled-out reference partial beams, it is also possible to carry out a numerical normalization on the basis of the detected signal of the position sensors detecting said reference beams or reference partial beams.

The at least two reference partial beams generated by the at least one diffraction grating of the beam regulating apparatus can be two partial beams of the same diffraction order or two partial beams of different diffraction orders. By way of example, one of the reference partial beams can constitute a first diffraction order of the illumination beam and another partial beam can constitute a zero order of diffraction of the illumination beam. In this case, one of the position sensors can be embodied with a filter element having an EUV throughput that changes monotonically over its area, and another of the position sensors can be embodied as a normalization detector for detecting, in particular, the zero order of diffraction of the illumination beam as a normalization beam.

The advantages of a position sensor device of an optical system and of a metrology system described herein correspond to those which have already been explained above with reference to the beam regulating apparatus. The optical system can additionally have a pupil-shaping component that predefines an illumination angle distribution for illuminating the object field. Said pupil-shaping component, which can be realized as a stop component, can operate independently of the beam regulating apparatus. In the metrology system, varying pupil illuminations, for example as a result of an emission characteristic of the light source that varies with time, can be compensated for by corresponding driving of the light source, for example by displacement of the light source, in particular by rotation of the light source. Sensors for the illumination beam or for coupled-out portions thereof can be provided in a pupil plane of the illumination optical unit. Such sensors can be arranged, for example, at the edge of a pupil of the illumination optical unit. These pupil sensors can detect a centroid displacement of an illumination of the pupil plane with the illumination beam and can track the light source by means of corresponding driving in terms of the operating point thereof and/or in terms of the position thereof and/or in terms of the orientation thereof by rotation such that the centroid of the pupil illumination is kept at a desired position.

BRIEF DESCRIPTION OF DRAWINGS

Exemplary embodiments of the invention are explained in greater detail below with reference to the drawings, in which.

DETAILED DESCRIPTION

Figure 1:
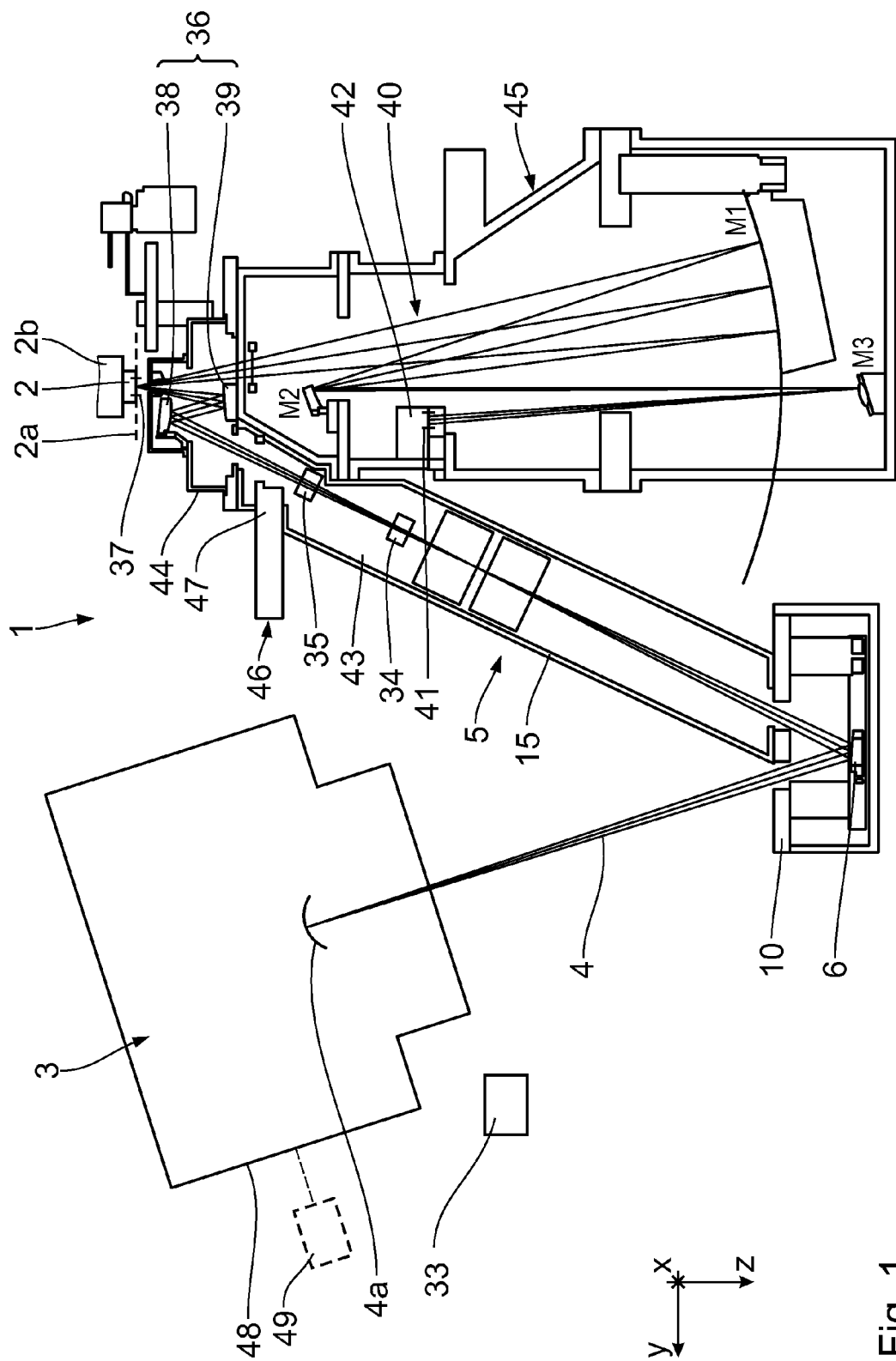
FIG. 1 schematically shows a metrology system for examining objects with an EUV light source system, containing a light source and a beam regulating apparatus for an illumination beam.

A metrology system 1 illustrated schematically in FIG. 1 serves for analyzing an object 2, for example a lithography mask, for patterning faults. The object 2 is arranged in an object plane 2a of the metrology system 1. The lithography mask can be used in EUV projection lithography in the context of producing patterned semiconductor components, for example memory chips. The object 2 is carried by an object holder 2b illustrated schematically.

A patterning fault of the object 2 that is to be examined can be examined with the aid of an analysis of a so-called aerial image (Aerial Image Measurement System). The metrology system 1 serves for simulating and analyzing the effects of, for example, the properties of lithography masks on an optical imaging of projection optical units within a projection exposure apparatus. A metrology system is known, in principle, from DE 102 20 815 A1.

The metrology system 1 is accommodated in an evacuated system chamber (not illustrated in more specific detail). A residual atmosphere in the system chamber can be predefined in a targeted manner, e.g. a low partial pressure in the range of, for example, a few $10^{-2}$ mbar $H_2$.

An EUV light source 3, which generates illumination emission in the form of an EUV illumination beam 4, serves for illuminating the object 2. The light source 3 can generate EUV using radiation in a wavelength range of between 2 nm and 30 nm, for example in the range of between 2.3 nm and 4.4 nm or in the range of between 5 nm and 30 nm. The light sources which are also customary for EUV lithography systems or projection exposure apparatuses are appropriate for the light source 3, that is to say for example laser plasma sources (LPP; Laser Produced Plasma) or else discharge sources (DPP; Discharge Produced Plasma).

A collector 4a indicated schematically in FIG. 1 can serve for acquiring and focusing the illumination beam 4. This can involve an ellipsoidal mirror and/or a nested collector. Corresponding collectors are known from the prior art. A beam regulating apparatus 5 for the illumination beam 4 is disposed downstream of the light source 3 in the illumination beam path.

The beam regulating apparatus 5 includes a regulating component that influences the illumination beam path in the form of a regulating mirror 6. The regulating mirror 6 is arranged downstream of the light source 3 in the beam path of the illumination beam 4. A reflective surface 7 (cf. FIG. 2) of the regulating mirror 6 is embodied in a curved fashion. The reflective surface 7 can be shaped ellipsoidally. The reflective surface 7 can have different curvatures in mutually perpendicular sectional planes for correspondingly influencing the shape of a further course of the illumination beam 4.

Figure 2:
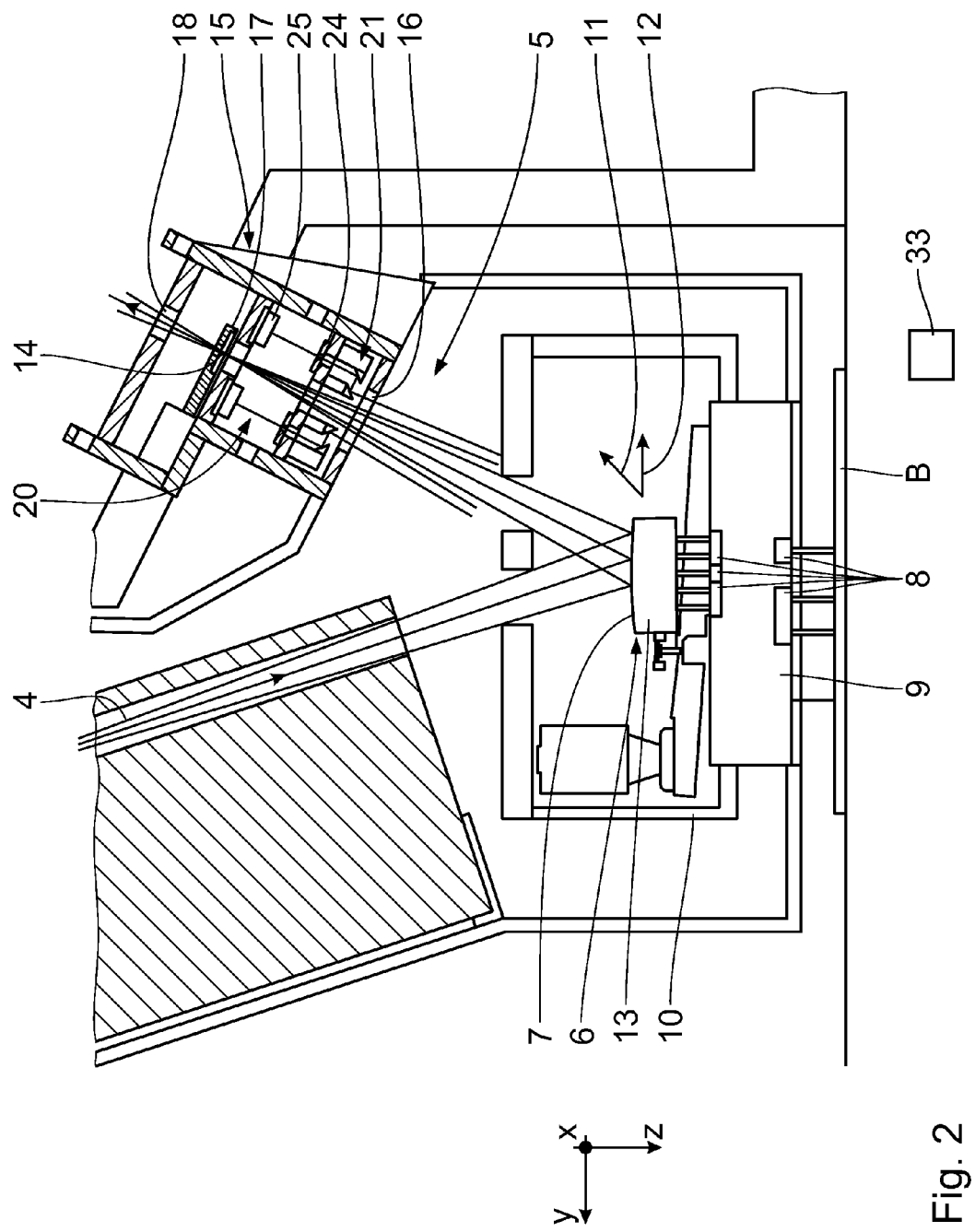
FIG. 2 shows, in an enlarged manner and in a manner not true to scale in comparison with FIG. 1, an excerpt from the metrology system in the region of a regulating component of the beam regulating apparatus in the form of a regulating mirror.

The regulating mirror 6 is displaceable in a controlled manner in a plurality of degrees of freedom by using a plurality of displacement actuators 8, illustrated schematically in FIG. 2. The displacement actuators 8 are carried by a mirror holder 9 for the regulating mirror 6. Operative connections between the displacement actuators 8 and the regulating mirror 6 are indicated schematically by solid lines in FIG. 2. The regulating mirror 6 is provided in a mirror chamber 10 with an entrance opening for the illumination beam 4 originating from the light source 3 and an exit opening for the illumination beam 4 reflected from the reflective surface 7. The regulating mirror 6 is tiltable about two mutually perpendicular tilting axes 11, 12 by two of the displacement actuators 8, which are embodied as tilting actuators that can be driven independently of one another.

In order to facilitate the description of positional relationships, a global xyz coordinate system is used hereinafter in connection with the description of FIGS. 1 and 2. The x-axis runs perpendicularly to the plane of the drawing in FIGS. 1 and 2 and out of the latter. The y-axis runs toward the left in FIGS. 1 and 2. The z-axis runs downward in FIGS. 1 and 2.

The tilting axis 11 runs parallel to the x-axis. The tilting axis 12 runs parallel to the y-axis. The tilting actuators 8 enable the regulating mirror 6 to be tilted about the tilting axes 11, 12 by +/−250 μrad. The tilting axes 11, 12 span a plane running parallel to a main body plane xy of a regulating mirror main body 13, which bears the reflective surface 7. The illumination beam 4 impinges on an intersection point of the two tilting axes 11, 12, which are schematically illustrated away from the regulating mirror 6 in FIG. 2. This ensures that tilting of the regulating mirror 6 results in the smallest possible beam offset of the illumination beam 4. Depending on the embodiment of the tilting actuators, the tilting axes 11, 12 can also run differently.

Further displacement actuators 8 of the mirror holder 9 enable a driven displacement of the mirror holder 9 relative to a base wall B of the system chamber of the metrology system 1. A displacement of the mirror holder 9 relative to the base wall B with a displacement distance of +/−5 mm in the z-direction is possible by means of one of the displacement actuators 8.

A displacement of the regulating mirror 6 relative to the mirror holder 9 along a displacement distance of +/−400 μm in the z-direction is possible by means of one of the displacement actuators 8.

The regulating mirror 6 is therefore also embodied in a displaceable fashion along at least one degree of freedom of translation.

Together with the collector 4a, the regulating mirror 6 is part of a collector-focusing optical unit for acquiring the illumination emission of the light source 3 and for focusing the acquired illumination beam 4 at an intermediate focus 14 disposed downstream of the regulating mirror 6. The regulating mirror 6 is therefore arranged upstream of the intermediate focus 14 in the illumination beam path.

Figure 3:
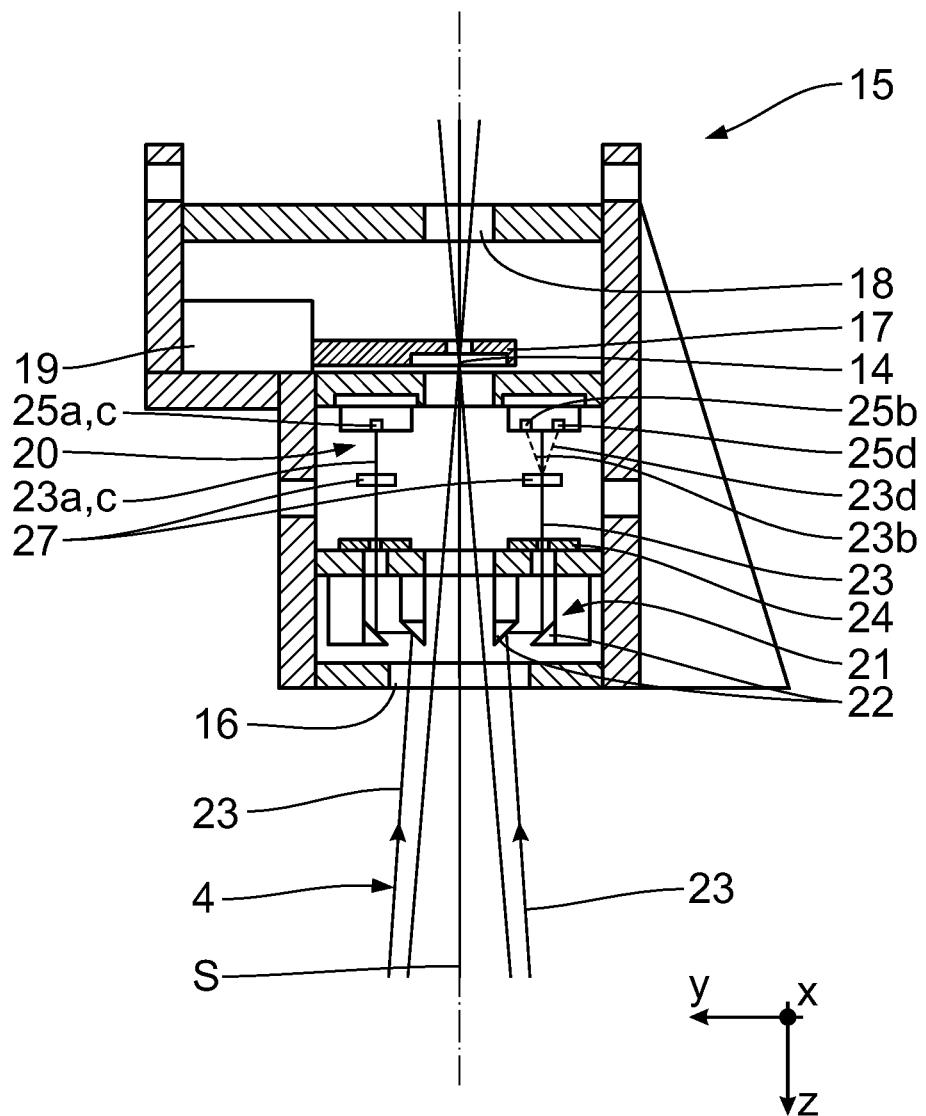
FIG. 3 shows, once again in an enlarged manner, an excerpt from FIG. 2 in the region of an intermediate focus module disposed downstream of the regulating mirror in the illumination beam path with a position sensor device for detecting a position of an intermediate focus of the illumination beam.

An intermediate focus module 15 of the beam regulating apparatus 5 is arranged in the region of the intermediate focus 14, said module being illustrated in an enlarged manner in FIG. 3. The intermediate focus module 15 has an entrance opening 16 for the illumination beam 4, an intermediate focus stop 17 at the location of the intermediate focus 14 and an exit opening 18 in the beam path of the illumination beam 4 downstream of the intermediate focus 14. The intermediate focus stop 17 can be exchanged for another intermediate focus stop by means of a driven changeable holder 19. This can be used for orientation and/or for determining the size of the intermediate focus 14.

In order to facilitate the description of positional relationships within the intermediate focus module 15, a local xyz coordinate system is plotted in FIG. 3. The x-axis runs perpendicularly to the plane of the drawing out of the latter. The y-axis runs toward the left in FIG. 3. The z-axis runs downward in FIG. 3 and parallel to a chief ray direction S of the illumination beam 4 through the intermediate focus module 15. The yz plane of the local xyz coordinate system corresponds to the yz plane of the global xyz coordinate system from FIGS. 1 and 2. The y- and z-axes are in each case rotated about the x-axis in the clockwise direction relative to the y- and z-axes of the global xyz coordinate system by an angle of incidence of the illumination beam 4 on the regulating mirror 6. The x-axis of the global xyz coordinate system corresponds to the x-axis of the local xyz coordinate system, that is to say runs parallel thereto.

Part of the intermediate focus module 15 is a position sensor device 20 for detecting a spatial position of the intermediate focus 14. The position sensor device 20 includes at least one coupling-out unit 21 having in each case two coupling-out mirrors 22 disposed downstream in the beam path of the coupled-out beam.

FIGS. 2 and 3 illustrate an embodiment of the position sensor device 20 having two coupling-out units 21 to the right and left of the passage of the illumination beam 4. The coupling-out units 21 can alternatively or additionally also be arranged such that they surround the chief ray direction S at the level of the two illustrated coupling-out units 21 in a manner spaced apart in the positive and negative x-direction, that is to say lie in front of and behind the plane of the drawing of FIG. 3. The coupling-out units 21 arranged in a manner distributed around the illumination beam 4 in the circumferential direction around the chief ray direction S couple out marginal beam components 23 of the illumination beam 4, which are not used for illuminating the object 2 and are also designated as reference beams. The marginal beam components 23 are guided via the coupling-out units 21 through coupling-out stops 24 toward position sensor units 25 of the intermediate focus module 15.

Figure 4:
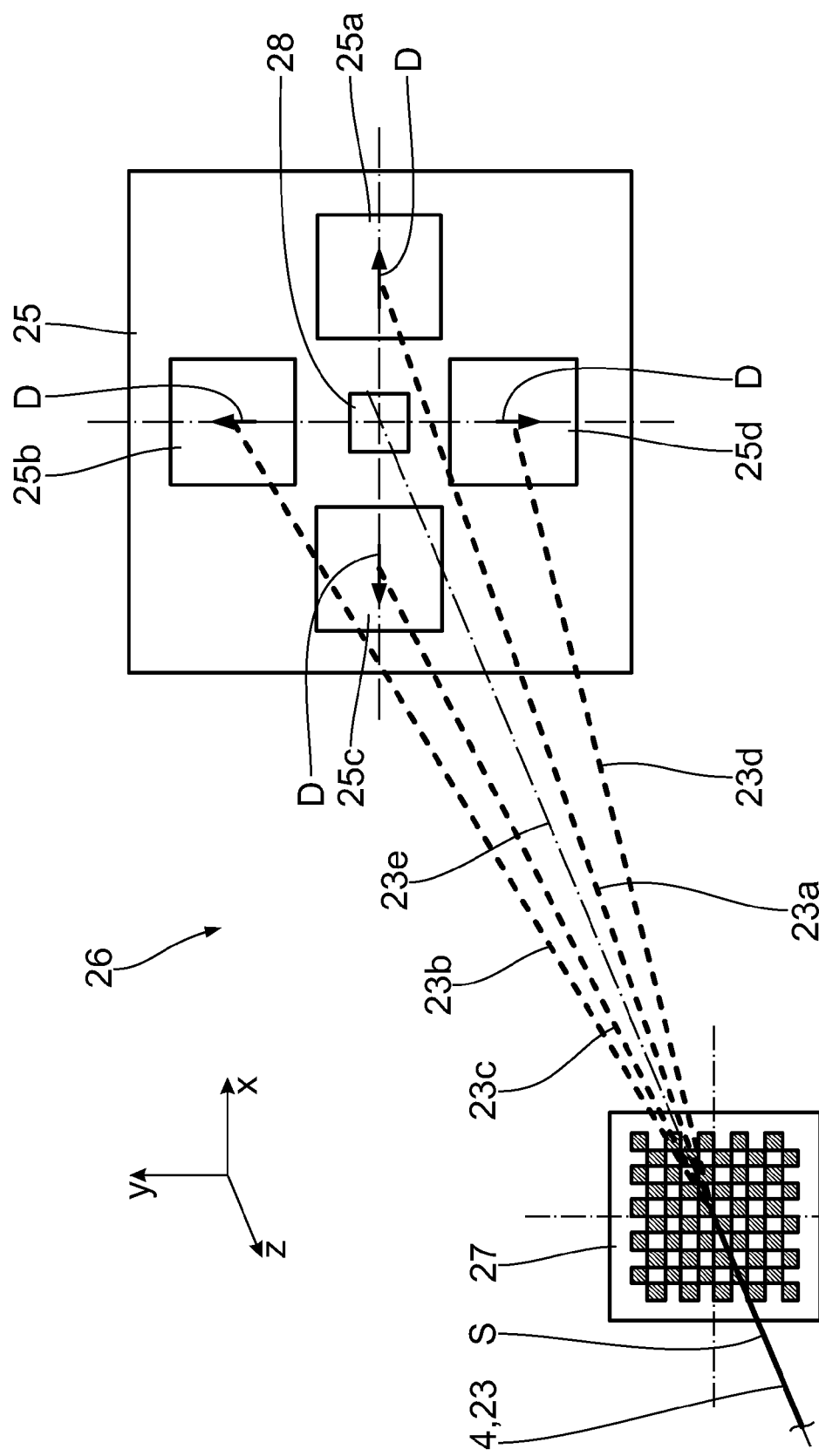
FIG. 4 shows in perspective view a position sensor device which can be used in the intermediate focus module according to FIG. 3, downstream of a coupling-out element.

FIG. 4 shows a further embodiment of a position sensor device 26, which manages with a single one of the coupling-out units 21 according to FIG. 3. Components corresponding to those which have already been explained above with reference to the position sensor device 20 according to FIG. 3 bear the same reference numerals and will not be discussed in detail again. The position sensor device 26 is illustrated for the beam path of a coupled-out beam component 23 downstream of the coupling-out mirrors 22.

The position sensor device 26 has a two-dimensional diffraction grating 27 for generating four reference partial beams 23a, 23b, 23c and 23d from the reference beam 23. The reference partial beams 23a to 23d constitute the +/− first diffraction orders of the reference beam 23 in the two spatial directions x and y. The reference partial beams 23a to 23d are therefore equally valid diffraction orders of the reference beam 23. The reference partial beams 23a to 23d all have absolutely the same diffraction order.

The position sensor unit 25 has a total of four position sensors 25a, 25b, 25d and 25c embodied as EUV photodiodes. One of the reference partial beams 23a to 23d is incident on each of the position sensors 25a to 25d. Each of the position sensors 25a to 25d is therefore assigned to exactly one of the reference partial beams 23a to 23d and serves for detecting this assigned reference partial beam 23a to 23d.

The diffraction grating 27 can be, for example, a phase grating.

The diffraction grating 27 can be blazed in order to give preference in particular to the first diffraction order, but also to a different diffraction order. The diffraction grating 27 can therefore be a blazed grating.

The diffraction grating 27 can be, for example, a cross grating.

In a further embodiment of a position sensor device which can be used instead of the position sensor device 26 and which is likewise explained with reference to FIG. 4, the two-dimensional diffraction grating 27 simultaneously serves as a coupling-out element. In this embodiment, rather than a coupled-out beam component, the illumination beam 4 itself is incident on the diffraction grating 27. A zero order of diffraction 23e, which is illustrated in a dash-dotted manner in FIG. 4, is then used for illuminating the object 2.

If the position sensor device 26 is used with a coupled-out beam component or reference beam 23, the zero order of diffraction 23e can also impinge on a normalization detector 28 and be detected by the latter. The zero order of diffraction 23e then constitutes a normalization beam that is coupled out from the illumination beam 4. For normalization it is also possible to use a higher diffraction order, for example a second diffraction order of the diffraction grating 27, the normalization detector 28 then being arranged such that it detects said higher diffraction order.

The position sensors 25a to 25d are configured as neutral wedge sensors, as is explained below on the basis of the example of the position sensor 25a for two different embodiments with reference to FIGS. 6 and 7. The further position sensors 25b to 25d are embodied correspondingly.

The position sensor 25a has an EUV-sensitive receiver area or detection area 29 embedded into a sensor main body 30. The receiver area 29 is coated with a filter element in the form of an absorber layer 31. Along a detection direction D, which in FIG. 4 is represented by an arrow on the respective position sensor 25a to 25d and runs parallel to the x-direction in the case of the position sensor 25a, the absorber layer 31 in the embodiment according to FIG. 6 has a linearly increasing thickness profile. In the embodiment according to FIG. 7, the absorber layer 31 has a logarithmically increasing thickness profile.

The detection direction D for the position sensor 25b runs in the positive y-direction. The detection direction D of the position sensor 25c runs in the negative x-direction. The detection direction D of the position sensor 25d runs in the negative y-direction.

In accordance with the respective thickness profile of the absorber layer 31 along the detection direction D, a corresponding dependence of a photocurrent I on the impingement point of the reference partial beam 23a on the photosensor 25a arises. The photocurrent I is therefore a measure of the impingement point of the reference partial beam 23a on the photosensor 25a. The photocurrent I is measured with the aid of a current measuring unit 32.

Figure 6:
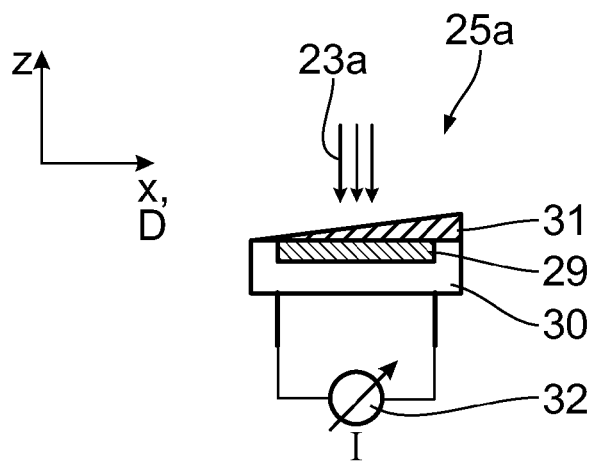
FIGS. 6 and 7 show two embodiments of a position sensor of the position sensor device according to FIG. 4.
Figure 7:
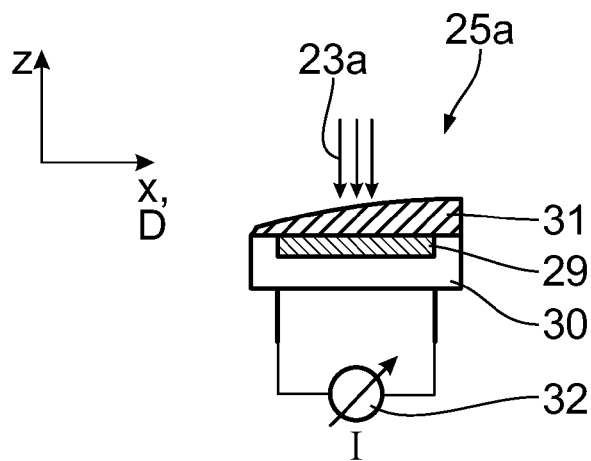

The thickness profiles of the absorber layers 31 according to FIGS. 6 and 7 constitute examples of filter elements which produce a monotonically changing EUV throughput over their areas.

The absorber layer 31 can be embodied as a neutral wedge with constant transmission per unit volume, in which a change in throughput arises exclusively on account of the thickness profile of the absorber layer 31. Alternatively, instead of an absorber layer 31 having a thickness profile, it is also possible to provide an absorber layer having a uniform layer thickness, in which a transmission that varies over the detection direction D arises for example as a result of a changing scattering center density or changing absorption.

The filter elements 31 according to FIGS. 6 and 7 are operated in transmission. In an embodiment that is not illustrated, a filter element upstream of the respective position sensor 25a to 25d can also be operated in reflection, in which a portion of the reference partial beam 23a to 23d that is reflected by the filter element is used for detection with the aid of the position sensor 25a to 25d.

A control/regulating device 33 illustrated schematically e.g. in FIG. 2 is signal-connected, in a manner not illustrated in more specific detail, firstly to the position sensors 25a to 25d of the position sensor device 20 and secondly to the displacement actuators 8.

The regulating device 33 calculates, from the sensor values which it obtains from the position sensor device 20 or 26 and the intermediate focus position signal resulting therefrom, control signals for the displacement actuators 8 and forwards them to the displacement actuators 8 for the xy position regulation of the intermediate focus 14 by means of a corresponding tilting of the regulating mirror 6. Therefore, a position of the intermediate focus 14 with regard to the position thereof transversely with respect to a beam direction is regulated. The desired position can vary temporally in this case. Such a temporal variation is also referred to as wobbling.

Figure 5:
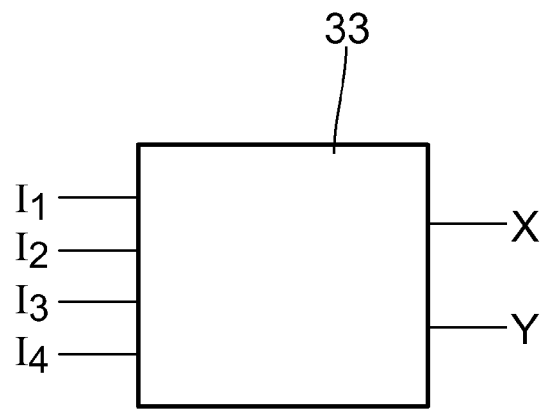
FIG. 5 shows a processing schematic diagram for the processing of photocurrents of photodiodes of the position sensor device according to FIG. 4 within a control/regulating device.

FIG. 5 shows by way of example how photocurrents $I_1$, $I_2$, $I_3$ and $I_4$ measured by the position sensors 25a, 25b, 25c and 25d are processed for determining control signals X, Y for the position correction of the illumination beam 4 perpendicular to the beam direction thereof in the x- and y-directions. Comparatively simple processing of the generated photocurrents $I_1$, $I_2$, $I_3$ and $I_4$ results on account of the use of absolutely the same diffraction order in the reference partial beams 23a to 23d.

A control signal X is calculated from the photocurrents $I_1$ and $I_3$ as follows:

$$X = \frac{I_1 - I_3}{I_1 + I_3}.$$

A control signal Y is calculated from the photocurrents $I_2$ and $I_4$ as follows:

$$Y = \frac{I_2 - I_4}{I_2 + I_4}.$$

The control signals X and Y are forwarded to the displacement actuators 8 for the corresponding tilting of the regulating mirror 6.

In the beam path of the illumination beam 4, a shutter unit 34 (illustrated schematically in FIG. 1) for the controlled interruption of illumination of the object 2, that is to say for the controlled blocking of the illumination beam 4, is arranged in the intermediate focus module 15. The shutter unit 34 can be an integral part of the metrology system 1. The shutter unit 34 is arranged downstream of the position sensor device 20 or 26 in the beam path of the illumination beam 4. This ensures position regulation uninfluenced by the shutter unit 34. An energy sensor device 35, illustrated schematically in FIG. 1, is disposed downstream of the shutter unit 34 in the beam path of the illumination beam 4. The energy sensor device 35 can be constructed, in principle, with coupling-out units and energy sensors in a manner like the position sensor device 20 or 26. In one variant, both the position sensor device 20 or 26 and the energy sensor device 35 can also be realized with three coupling-out units and three sensors arranged in a star-shaped fashion around a center through which the illumination beam 4 passes. The energy of the illumination beam 4 allowed to pass through the intermediate focus stop 17 can be measured by means of the energy sensor device 35. Said energy is all the higher, the better a z-position of the intermediate focus 14 corresponds to the z-position of the intermediate focus stop 17. Therefore, a z-position determination of the intermediate focus 14 is possible by means of the energy sensor device 21. This z-position determination is advantageous in the beam regulating apparatus 5, but is not an absolute necessity. The energy sensor device 35 is also signal-connected to the regulating device 33 via a signal line (not illustrated). From the energy sensor device 35, the regulating device 33 receives a z-position signal for the intermediate focus 14. For the z-position determination, a z-oscillation can also be modulated onto the regulating mirror 6, said oscillation, for example in the lock-in method, being detected in a phase-correlated manner with the energy sensor device 35. A signed amplitude of the measurement result is then directly proportional to a defocusing of the intermediate focus 14, that is to say provides a measure of the z-position which would be used for the z-position determination of the intermediate focus 14 and also for the z-position regulation by means of corresponding driving, with feedback, of a z-position of the regulating mirror 6.

Disposed downstream of the energy sensor device 35 is an imaging illumination optical assembly 36 for imaging the intermediate focus 14 onto an object field 37 to be illuminated in the object plane 2a, in which the structure to be illuminated of the object 2 is arranged. The illumination optical assembly 36 has two EUV mirrors 38 and 39.

The object field 37 is imaged into an image field 41 via an imaging optical unit in the form of a projection lens 40 having mirrors M1, M2 and M3. A measurement pick-up 42, in the form of a CCD image sensor, that detects the image field 41 is arranged at the location of the image field 41. Alternatively, the measurement pick-up 42 can be a CMOS camera or a fluorescent screen. The intermediate focus module 15, the shutter unit 34 and the energy sensor device 35 are arranged in an intermediate focus chamber 43. The illumination optical assembly 36 is arranged in an illumination optical chamber 44. The projection lens 40 is accommodated in a lens chamber 45, which, for its part, is subdivided into a plurality of partial chambers.

The beam regulating apparatus 5 and the projection lens 40 are part of an optical system of the metrology system 1. The position sensors 25 and the measurement pick-up 42 are configured such that they are sensitive to the beam component 23 and the components of the illumination beam 4 which contribute to the imaging of the object field 37.

A stop unit 46 having a further stop 47 for the illumination beam 4 is arranged between the energy sensor device 35 and the illumination optical assembly 36. The stop 47 is mounted in the intermediate focus chamber 43. The stop 47 is arranged in a pupil plane of the illumination, such that the illumination angles with which the object field 2 is illuminated by means of the illumination beam 4 can be selected by means of a selection of the components of the illumination beam 4 which are allowed to pass through the stop 47.

The beam regulating apparatus 5 operates as follows: the position sensor device 20 or 26 detects the xy position of the intermediate focus 14. Deviations of an actual position of the intermediate focus 14 from a predefined desired position are detected by the regulating device 33 by evaluation of the respective position signals and positioned into the control signals X, Y for the displacement actuators 8, such that the actual position of the intermediate focus 14 is tracked from a predefined desired position. The sub-aperture of the illumination beam 4 that in each case illuminates the object field 37 is selected by means of the stop unit 46. The regulating device 33 can be embodied such that a temporally variable desired position of the intermediate focus 14 is readjusted. Said temporally variable desired position can be predefined as a spiral path in which the desired position of the intermediate focus 14 moves in an intermediate focus plane with a radius that becomes larger and smaller segmentally. Accordingly, the actual position of the intermediate focus 14 is tracked to said desired position. As an alternative or in addition to such spiral path tracking, wobbling of the illumination beam 4 can be effected by means of actuator-based tilting or displacement of the regulating component, that is to say of the regulating mirror 6 and/or of a carrying frame 48 for the light source 3.

On account of the movement of the intermediate focus 14, the imaging of the intermediate focus 14 into the object field 2 results in a corresponding movement of that component of the illumination beam 4 which is used for illuminating the object 2b. Therefore, in accordance with the tracking of the intermediate focus 14 over the course of time, the object field 2 is illuminated with different components of the entire illumination beam 4 available. In this way, a homogenization of the illumination is obtained since local heterogeneities within the respectively used components of the illumination beam 4 on the object 2b during the illumination thereof average out. The stop 47 is used to predefine an illumination angle distribution during the illumination of the object field 2.

In the above-described embodiment of the metrology system 1 according to FIGS. 1 to 3, the regulating mirror 6 constitutes the regulating component of the beam regulating apparatus 5. Alternatively or additionally, the regulating component can also be formed by the displaceable carrying frame 48 for the light source 3. In this case, the carrying frame 48 of the light source 3 is mechanically connected to a displacement actuator 49, as indicated in a dashed manner in FIG. 1. A displacement of the light source 2 in at least two degrees of freedom of translation transversely with respect to the beam direction of the illumination beam 4 is possible by means of the displacement actuator 49. A displacement with more than two degrees of freedom can also be realized depending on the configuration of the displacement actuator 49 or a corresponding group of displacement actuators for the carrying frame 48. In this configuration, an xy-position and preferably a z-position of the intermediate focus 14 is realized by means of tracking of the carrying frame 48 of the light source 3 with the displacement actuator 49. For this purpose, the at least one displacement actuator 49 is in turn signal-connected to the regulating device 33 and is driven in a manner corresponding to what has been explained above in connection with the displacement actuators 8.

When the metrology system 1 is used, the object 2 within the object field 37 is illuminated with the illumination beam 4, the beam guiding of which is regulated by means of the beam regulating apparatus 5. The structures of the object 2 which are situated in the object field 37 are imaged onto the measurement pick-up 42.

An alternative or additional embodiment of the beam regulating apparatus 5 involves measuring a relative difference in the beam intensity which is detected by opposite sensors of the energy sensor device 35. In this case, said opposite sensors detect coupled-out components of the illumination beam 4 at opposite cross-sectional positions of the illumination beam 4. An actuating signal for a tilting of the EUV light source 3 by the displacement actuators 49 is derived from the measured intensity difference.

Instead of a tilting of the regulating mirror 6, the position of the intermediate focus 14 can also be readjusted by the regulating mirror 6 being displaced in its x-y-position, that is to say shifted laterally. This presupposes that the regulating mirror 6 is not embodied in a planar fashion, but rather in a curved fashion.

Figure 8:
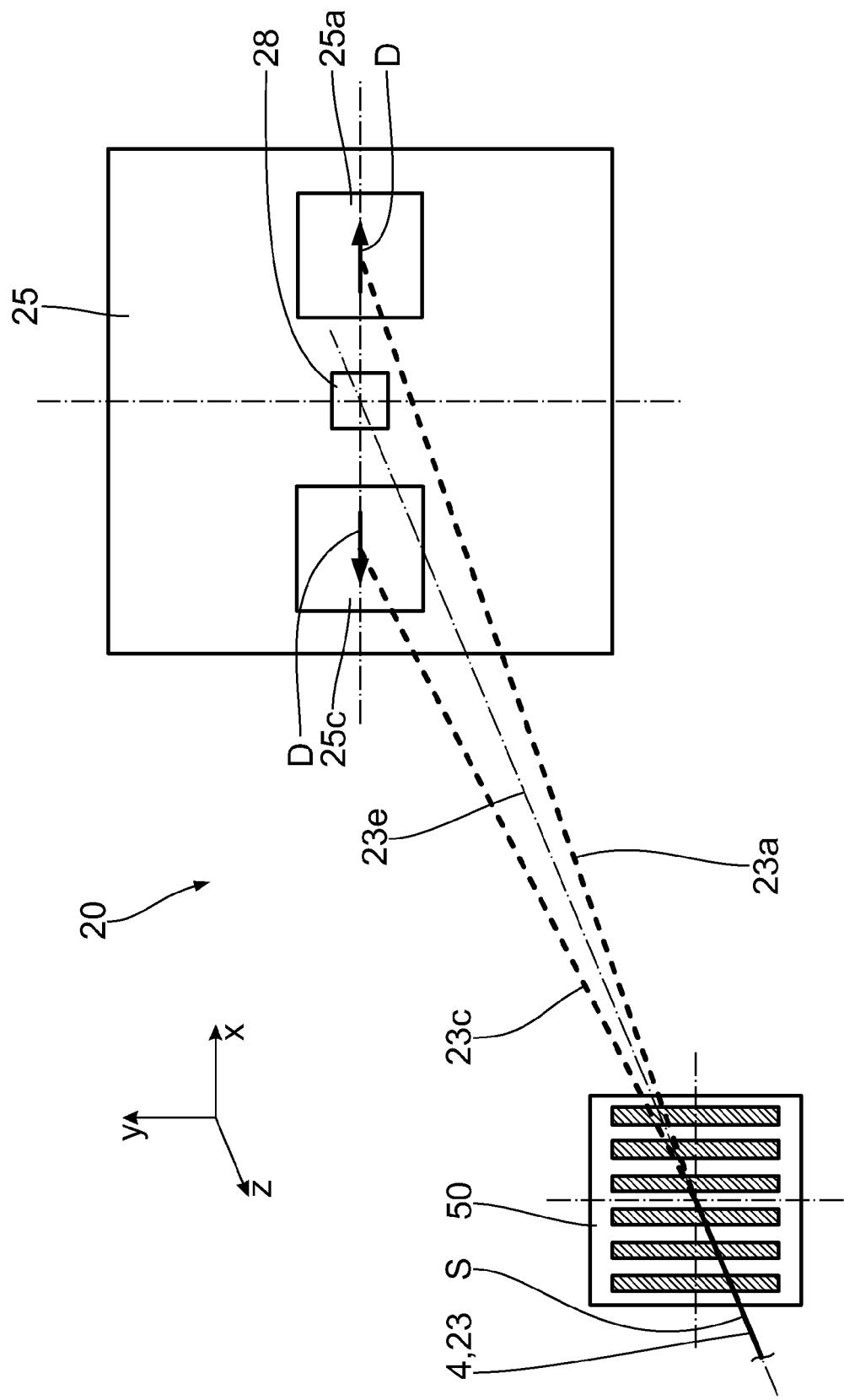
FIGS. 8 and 9 show two position sensor units each having position sensors arranged in pairs, which form a position sensor device which can be used instead of the position sensor device according to FIG. 4 in the intermediate focus module of the metrology system.
Figure 9:
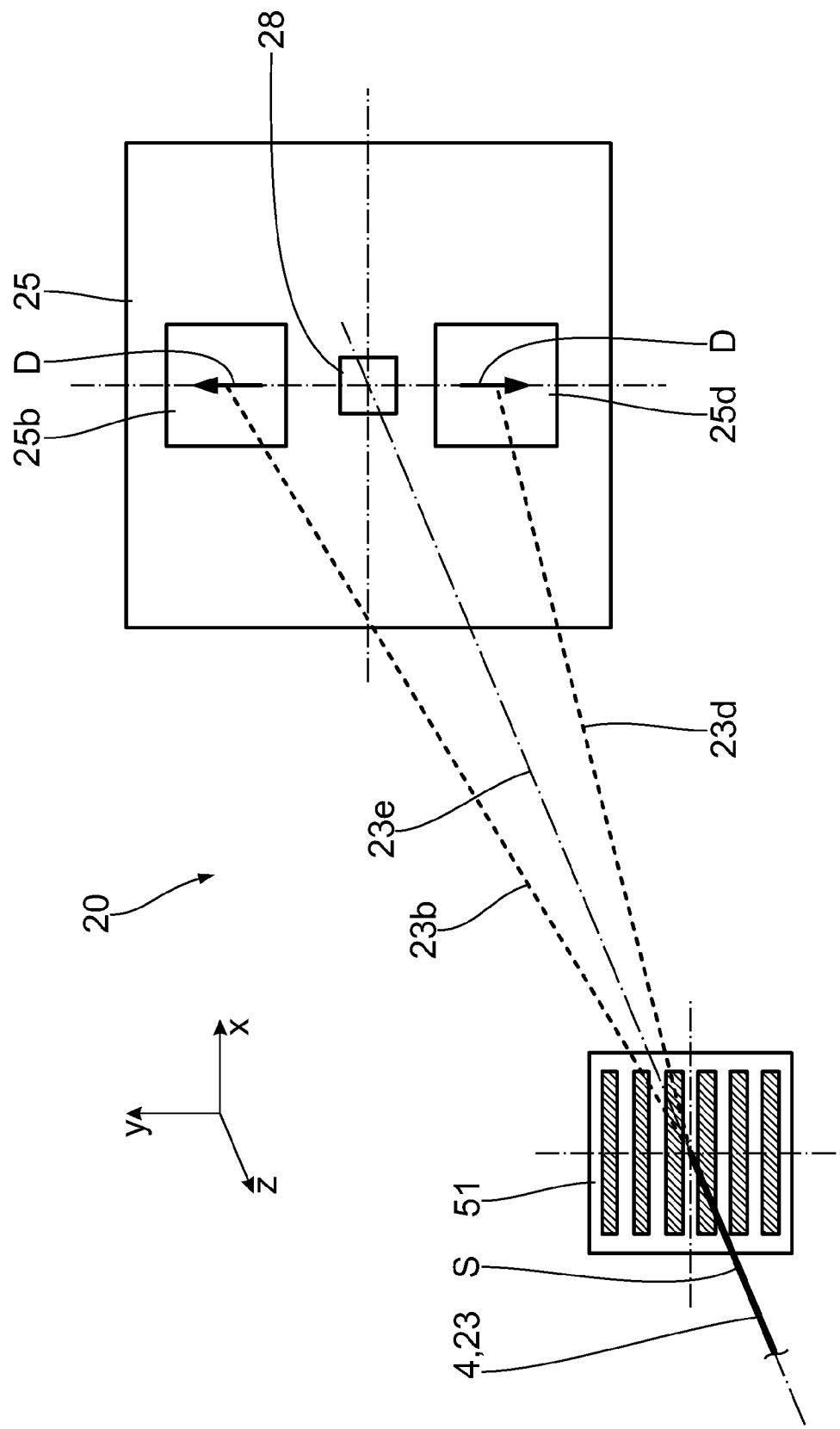

With reference to FIGS. 8 and 9, that embodiment of the position sensor device 20 which is also illustrated in FIGS. 2 and 3 will be explained below. Components corresponding to those which have already been explained above with reference to FIGS. 1 to 7, and in particular with reference to FIGS. 4 to 7, bear the same reference numerals and will not be discussed in detail again.

The position sensor device 20 according to FIGS. 2, 8 and 9 is embodied with two position sensor units, which have in each case two position sensors 25a, 25c, on the one hand, and 25b, 25d, on the other hand, arranged in pairs. In this case, the position sensors 25a and 25c serve for determining a beam position of the illumination beam 4 by means of the reference beam 23 along the beam position dimension x and the position sensors 25b and 25d serve for position determination along the beam position dimension y. In the beam path of the respective reference beam 23, a respective one-dimensional diffraction grating 50, 51 is disposed upstream of the position sensor pairs 25a, 25c and 25b, 25d, on the other hand. The diffraction grating 50 in the beam path of the reference beam 23 upstream of the position sensors 25a, 25c has diffraction structures oriented parallel to the y-direction. The diffraction grating 51 in the beam path of the further reference beam 23 upstream of the position sensors 25b, 25d has diffraction structures oriented parallel to the x-direction.

The arrangement of the position sensors 25a to 25d and of the diffraction gratings 50, 51 according to FIGS. 8 and 9 can also be used for detecting the beam position dimension directly at the illumination beam 4, that is to say without upstream coupling-out, as has already been explained above on the basis of the position sensor device 26. In this case, the two diffraction gratings 50, 51 are arranged at a sufficient distance one behind the other in the beam path of the illumination beam 4.

In the case of the subunit of the position sensor device 20 according to FIG. 8, the diffraction grating 50 generates reference partial beams 23a, 23c, that are detected by the position sensors 25a, 25c. In the case of the subunit of the position sensor device 20 according to FIG. 9, reference partial beams 23b, 23d are generated which are deflected in the positive and the negative y-direction, respectively, and are detected by the position sensors 25b and 25d. The reference partial beams 23a to 23d once again constitute in each case +/− first diffraction orders. Therefore, the reference partial beams 23a to 23d once again have absolutely the same diffraction order. In the embodiment according to FIGS. 8 and 9, too, control signals X, Y are generated from the correspondingly measured photocurrents of the position sensors 25a to 25d, as has already been explained above in connection with FIG. 5.

The generation of the control signals X and Y can take place in a manner corresponding to what is already known to the person skilled in the art in connection with PSD detectors (optical position sensors, position sensitive device).

In a further embodiment of the beam regulating apparatus, the position sensor device can use one of the reference partial beams 23a, 23b, 23c, 23d as one of the beam components used for position detection and the zero order of diffraction 23e as another of the beam components used for position detection. Alongside one of the position sensors 25a, 25b, 25c, 25d, which is embodied with a filter element 31 in accordance with the embodiments according to FIGS. 6 and 7, the position sensor device in this case has the normalization detector 28 as a second position sensor.

A number of implementations have been described. Nevertheless, it will be under-stood that various modifications may be made. For example, elements of one or more implementations may be combined, deleted, modified, or supplemented to form further implementations. In addition, other components may be added to, or removed from, the described position measuring device. Accordingly, other implementations are within the scope of the following claims.

What is claimed:

1. A beam regulating apparatus for an EUV illumination beam comprising:
    a position sensor device;
    a control/regulating device, which is signal-connected to the position sensor device; and
    at least one beam regulating component which influences a beam path of the illumination beam and which is signal-connected to the control/regulating device;
    wherein the position sensor device comprises at least one diffraction grating for generating at least two reference partial beams from the illumination beam, with a respective position sensor, assigned to one of the reference partial beams, for detecting the assigned reference partial beam;
    wherein the detected reference partial beams are partial beams generated by diffraction at the diffraction grating with the same absolute diffraction order.

2. The beam regulating apparatus of claim 1, wherein the – first and the + first diffraction order at the diffraction grating are used for generating the at least two reference partial beams.

3. The beam regulating apparatus of claim 2, comprising at least one coupling-out element for coupling out a reference beam from the illumination beam, wherein the at least one diffraction grating is designed for generating the at least two reference partial beams from the reference beam.

4. The beam regulating apparatus of claim 2, comprising a filter element having an EUV throughput that changes monotonically over its area, and is arranged in the beam path of the reference partial beams upstream of an EUV-sensitive receiver area of the position sensor.

5. The beam regulating apparatus of claim 1, comprising at least one coupling-out element for coupling out a reference beam from the illumination beam, wherein the at least one diffraction grating is designed for generating the at least two reference partial beams from the reference beam.

6. The beam regulating apparatus of claim 5, comprising position sensors arranged in pairs and serving for detecting a respective beam position dimension (x, y) transversely with respect to the beam direction (z) of the illumination beam.

7. The beam regulating apparatus of claim 6, comprising a filter element having an EUV throughput that changes monotonically over its area, and is arranged in the beam path of the reference partial beams upstream of an EUV-sensitive receiver area of the position sensor.

8. The beam regulating apparatus of claim 5, comprising a filter element having an EUV throughput that changes monotonically over its area, and is arranged in the beam path of the reference partial beams upstream of an EUV-sensitive receiver area of the position sensor.

9. The beam regulating apparatus of claim 1, wherein the position sensors comprise photodiodes.

10. The beam regulating apparatus of claim 9, comprising a filter element having an EUV throughput that changes monotonically over its area, and is arranged in the beam path of the reference partial beams upstream of an EUV-sensitive receiver area of the position sensor.

11. The beam regulating apparatus of claim 1, comprising a filter element having an EUV throughput that changes monotonically over its area, and is arranged in the beam path of the reference partial beams upstream of an EUV-sensitive receiver area of the position sensor.

12. The beam regulating apparatus of claim 1, wherein the diffraction grating comprises a two-dimensional grating.

13. The beam regulating apparatus of claim 1, comprising a plurality of diffraction gratings, in which each diffraction grating comprises a one-dimensional grating.

14. The beam regulating apparatus of claim 1, comprising at least one normalization detector which detects a normalization beam coupled out from the illumination beam.

15. A position sensor device for use in a beam regulating apparatus according to claim 1.

16. An optical system comprising:
    a beam regulating apparatus according to claim 15, and
    an imaging optical unit for imaging an object field, which is illuminated with the illumination beam, into an image field.

17. A metrology system for examining objects, the metrology system comprising:
    an optical system according to claim 16,
    a light source for generating the illumination radiation, and
    a measurement pick-up that detects the image field.

18. The beam regulating apparatus of claim 1, comprising at least one coupling-out element for coupling out a reference beam from the illumination beam, wherein the at least one diffraction grating is designed for generating the at least two reference partial beams from the reference beam.

19. The beam regulating apparatus of claim 1, comprising a filter element having an EUV throughput that changes monotonically over its area, and is arranged in the beam path of the reference partial beams upstream of an EUV-sensitive receiver area of the position sensor.

20. A beam regulating apparatus for an EUV illumination beam comprising:
    a position sensor device;
    a control/regulating device, which is signal-connected to the position sensor device;
    at least one beam regulating component which influences a beam path of the illumination beam and which is signal-connected to the control/regulating device,
    wherein the position sensor device comprises at least one diffraction grating for generating at least two reference partial beams from the illumination beam, with a respective position sensor, assigned to one of the reference partial beams, for detecting the assigned reference partial beam;

at least one coupling-out element for coupling out a reference beam from the illumination beam, in which the at least one diffraction grating is designed for generating the at least two reference partial beams from the reference beam; and a filter element having an EUV-throughput that changes monotonically over its area, and is arranged in the beam path of the reference partial beams upstream of an EUV-sensitive receiver area of the position sensor.

* * * * *